(12) United States Patent
Yen et al.

(10) Patent No.: US 8,896,007 B2
(45) Date of Patent: Nov. 25, 2014

(54) SEMICONDUCTOR LIGHT-EMITTING DEVICE AND FABRICATING METHOD THEREOF

(71) Applicant: High Power Opto. Inc., Taichung (TW)

(72) Inventors: Wei-Yu Yen, Taichung (TW); Li-Ping Chou, Taichung (TW); Fu-Bang Chen, Taichung (TW); Chih-Sung Chang, Taichung (TW)

(73) Assignee: High Power Opto, Inc., Taichung (TW)

( * ) Notice: Subject to any disclaimer, the term of this patent is extended or adjusted under 35 U.S.C. 154(b) by 0 days.

(21) Appl. No.: 13/735,322

(22) Filed: Jan. 7, 2013

(65) Prior Publication Data

US 2014/0070247 A1    Mar. 13, 2014

(30) Foreign Application Priority Data

Sep. 12, 2012 (TW) .............................. 101133344 A

(51) Int. Cl.
| | |
|---|---|
| H01L 33/60 | (2010.01) |
| H01L 33/14 | (2010.01) |
| H01L 33/40 | (2010.01) |
| H01L 33/22 | (2010.01) |
| H01L 33/44 | (2010.01) |

(52) U.S. Cl.
CPC ................ *H01L 33/60* (2013.01); *H01L 33/14* (2013.01); *H01L 33/405* (2013.01); *H01L 33/22* (2013.01); *H01L 33/44* (2013.01)
USPC ................ 257/98; 438/29; 438/458; 438/27; 438/153; 438/46

(58) Field of Classification Search
USPC ......................... 257/98, E33.06, 100, 686, 88
See application file for complete search history.

(56) References Cited

U.S. PATENT DOCUMENTS

| | | | |
|---|---|---|---|
| 6,242,761 B1 * | 6/2001 | Fujimoto et al. ................. | 257/94 |
| 7,795,623 B2 | 9/2010 | Emerson et al. | |
| 8,017,963 B2 | 9/2011 | Donofrio et al. | |
| 2013/0234182 A1 * | 9/2013 | Katsuno et al. ................. | 257/98 |

* cited by examiner

*Primary Examiner* — Chuong A Luu
*Assistant Examiner* — Rodolfo Fortich
(74) *Attorney, Agent, or Firm* — WPAT, PC; Justin King

(57) ABSTRACT

A semiconductor light-emitting device comprises a light-emitting epitaxial structure, a first electrode structure, a light reflective layer and an resistivity-enhancing structure. The light-emitting epitaxial structure has a first surface and a second surface opposite to the first surface. The first electrode structure is electrically connected to the first surface. The light reflective layer is disposed adjacent to the second surface. The resistivity-enhancing structure is disposed adjacent to the light reflective layer and away from the second surface corresponding to a position of the first electrode structure.

5 Claims, 4 Drawing Sheets

SEMICONDUCTOR LIGHT-EMITTING DEVICE AND FABRICATING METHOD THEREOF

BACKGROUND OF THE INVENTION

1. Field of the Invention

The present invention relates to a semiconductor device and the fabricating method thereof, and more particularly, to a semiconductor light-emitting device and the fabricating method thereof.

2. Description of Related Art

Semiconductor light-emitting devices, e.g. light emitting diodes, have been increasingly widespread used in fields of lighting, display panel, indicator lamp, etc. An epitaxial structure of a light emitting diode includes at least two semiconductor layers with opposite conductivity types to form a p-n junction at the boundary of the two semiconductor layers. When a semiconductor light-emitting device is subjected to a voltage, electric current is introduced to passing through the semiconductor layers from one electrode to another along a shortest route, and charge-carriers—electrons and electron holes—combination occurs within the p-n junction, whereby the electrical energy is converted into light and emitted from the semiconductor light-emitting device.

However, since the converted light typically emits from an area of the p-n junction intersected with the shortest route of the electric current, and the shortest route of the electric current typically aligns to these two electrodes which are typically non-transparent, thus large amount of the emitting light would be shielded and absorbed by these electrodes. As a result, light-emitting efficiency of the conventional semiconductor light-emitting devices would be significantly reduced.

Therefore, there is a need to improve the light-emitting efficiency of the conventional semiconductor light-emitting devices.

SUMMARY OF THE INVENTION

In accordance with an aspect of the present invention, a semiconductor light-emitting device is provided in order to enhance the light-emitting efficiency of the device, wherein the semiconductor light-emitting device comprises a light-emitting epitaxial structure, a first electrode structure, a light reflective layer and an resistivity-enhancing structure. The light-emitting epitaxial structure has a first surface and a second surface opposite to the first surface. The first electrode structure is electrically connected to the first surface. The light reflective layer is disposed adjacent to the second surface. The resistivity-enhancing structure is disposed adjacent to the light reflective layer and away from the second surface corresponding to a position of the first electrode structure.

In one embodiment of the present invention, the light-emitting epitaxial structure comprises a first semiconductor layer with a first conductivity type, a second semiconductor layer with a second conductivity type and a light-emitting layer. The first semiconductor layer has a surface serving as the first surface. The second semiconductor layer has a surface serving as the second surface. The light-emitting layer is disposed between the first semiconductor layer and the second semiconductor layer.

In one embodiment of the present invention, the resistivity-enhancing structure has an edge aligning with that of the first electrode structure.

In one embodiment of the present invention, the resistivity-enhancing structure has a central axial aligning with that of the first electrode structure.

In one embodiment of the present invention, the semiconductor light-emitting device further comprises a buffer layer, a binding layer, a substrate and a second electrode structure. The buffer layer is disposed adjacent to the light reflective layer and the resistivity-enhancing structure. The binding layer is disposed adjacent to the buffer layer and away from the light reflective layer. The substrate is disposed adjacent to the binding layer and away from the buffer layer. The second electrode structure is electrically connected to the substrate.

In one embodiment of the present invention, the semiconductor light-emitting device further comprises a protection structure surrounding a sidewall of the light reflective layer, wherein the protection structure is enveloped with the buffer layer.

In one embodiment of the present invention, the resistivity-enhancing structure is disposed in the buffer layer.

In one embodiment of the present invention, the resistivity-enhancing structure directly contacts with the light reflective layer.

In one embodiment of the present invention, the semiconductor light-emitting device further comprises a protection structure surrounding a sidewall of the light reflective layer.

In accordance with another aspect of the present invention, a method for fabricating a semiconductor light-emitting device is provided; wherein the method comprises steps as follows: A light-emitting epitaxial structure with a first surface and a second surface opposite to the first surface is firstly formed, and a light reflective layer is then formed over the second surface. Next, a resistivity-enhancing structure is formed over the light reflective layer. Subsequently, a first electrode structure electrically connected to the first surface is formed corresponding to a position of the resistivity-enhancing< structure.

In one embodiment of the present invention, the step of forming the light-emitting epitaxial structure comprises steps as follows: A light-emitting layer is formed over a first semiconductor layer having a first conductivity type and a surface serving as the first surface, wherein the light-emitting layer is disposed away from the first surface. A second semiconductor layer having a second conductivity type is then formed over the light-emitting layer, wherein the second semiconductor layer has a surface serving as the second surface.

In one embodiment of the present invention, the method further comprises a step of forming a closed protection structure over the second semiconductor layer prior to the step of forming the light reflective layer, wherein the light reflective layer is filled into the closed protection structure.

In one embodiment of the present invention, the method further comprises a step of forming a protection structure surrounding a sidewall of the light reflective layer.

In one embodiment of the present invention, the protection structure and the resistivity-enhancing structure are formed simultaneously.

In one embodiment of the present invention, the method further comprises steps as follows: A buffer layer is formed over the light reflective layer, wherein the buffer layer covers the resistivity-enhancing structure. A binding layer is then formed over the buffer layer. Next, a substrate is formed over the binding layer. Subsequently, a second electrode structure is formed over the substrate, wherein the second electrode structure is electrically connected to the substrate.

In one embodiment of the present invention, the resistivity-enhancing structure is formed in the buffer layer.

In one embodiment of the present invention, the method further comprises a step of forming a protection structure surrounding a sidewall of the light reflective layer, wherein the protection layer is enveloped with the buffer layer.

BRIEF DESCRIPTION OF THE DRAWINGS

The above objects and advantages of the present invention will become more readily apparent to those ordinarily skilled in the art after reviewing the following detailed description and accompanying drawings, in which.

DESCRIPTION OF EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
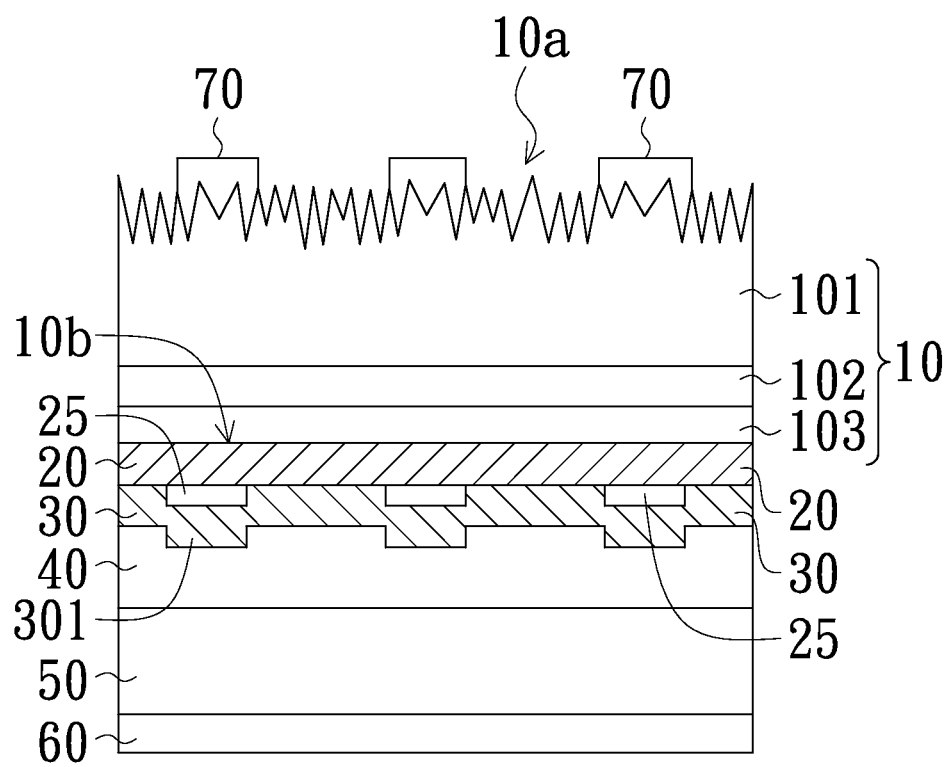
FIG. 1 is a cross-sectional view illustrating a semiconductor light-emitting device in accordance with a first embodiment of the present invention.

With reference to FIG. 1, a cross-sectional view of a semiconductor light-emitting device in accordance with the first embodiment of the present invention is schematically illustrated. The method for fabricating the semiconductor light-emitting device comprises steps as follows: Firstly, a first substrate is provided (not shown) and an epitaxial structure 10 is then formed over the first substrate. In some embodiments, the forming of the epitaxial structure 10 includes steps of forming a first semiconductor layer 101, a light-emitting layer 102, and a second semiconductor layer 103 over the first substrate sequentially, wherein a surface of the first semiconductor layer 101 that is disposed adjacent to the first substrate is referred as a first surface 10a of the epitaxial structure 10, and a surface of the second semiconductor layer 103 that is disposed opposite to the first surface 10a is referred as a second surface 10b of the epitaxial structure 10. Besides, the light emitting layer 102 is disposed away from the first surface 10a and the second surface 10b.

The first semiconductor layer 101 has a conductivity type opposed to that of the second semiconductor layer 103, and the conductivity types of the first semiconductor layer 101 and the second semiconductor layer 103 are interchangeable. For example, the former can be an N-type doped layer and the later can be a P-type doped layer or vice versa. The first semiconductor layer 101 and the second semiconductor layer 103 may be made of (but not limited to) group-III elements nitride, e.g. gallium nitride (GaN), aluminum nitride (AlN), indium nitride (InN), aluminum gallium nitride (AlGaN), or indium gallium nitride (InGaN), etc.

In the first embodiment of the present invention, a light reflective layer 20 is formed over the second surface 10b of the epitaxial structure 10 used to reflect the light generated from the light-emitting layer 102 in order to direct the light emitting outwards from the first surface 10a. The light reflective layer 20 may be a metal coating made of silver, nickel, aluminum, silver/titanium tungsten/platinum alloy or the like. For example, in some embodiments, the light reflective layer 20 may be made of silver/titanium tungsten/platinum alloy including a silver layer with a thickness ranging from 100 nanometers to 300 nanometers, a titanium tungsten layer with a thickness ranging from 200 nanometers to 300 nanometers and a platinum layer with a thickness substantially less than 500 nanometers. In another embodiment, the light reflective layer 20 may consist of silver/titanium/platinum alloy including a silver layer with a thickness ranging from 200 nanometers to 300 nanometers, a titanium layer with a thickness ranging from 200 nanometers to 300 nanometers and a platinum layer with a thickness substantially less than 500 nanometers. In addition, the platinum layer of the former embodiment may be replaced by a nickel layer with the same thickness. In a further embodiment, the light reflective layer 20 may be made of silver/nickel alloy coating including a silver layer with a thickness ranging from 200 nanometers to 300 nanometers and a nickel layer with a thickness less than 500 nanometers.

Then, a plurality of resistivity-enhancing structures 25 are formed over the light reflective layer 20. The resistivity-enhancing structures 25 are capable of reducing the conductivity of the regions where the resistivity-enhancing structures 25 are disposed. The resistivity-enhancing structures 25 may be made of an insulation material selected from a group consisting of silicon dioxide (SiO2), titanium dioxide (TiO2), Indium tin oxide (ITO), silicon nitride (SiN), aluminum nitride (AlN), and the arbitrary combinations thereof.

Since molecules of the light reflective layer 20 would easily migrate during the semiconductor manufacturing process for fabricating the semiconductor light-emitting device, thus a buffer layer 30 that can prevent the molecules of the light reflective layer 20 from migration is subsequently formed over the light reflective layer 20 and the resistivity-enhancing structure 25. The buffer layer 30 that has good conductivity and stability may be a multi-layer structure comprising at least two kinds of metals, such as, titanium, platinum, titanium tungsten, nickel, aluminum, etc.

Next, a binding layer 40, a second substrate 50, and a second electrode structure 60 are sequentially formed over the light reflective layer 20, wherein the second electrode structure 60 is electrically connected to the second substrate 50. Beside, the binding layer 40, which may be made of gold indium or gold tin, is used to bind the second substrate 50 with the light reflective layer 20 (or the buffer layer 30).

In addition, the buffer layer 30 formed both on the resistivity-enhancing structures 25 and the light reflective layer 20 is uneven. It is because that the buffer layer 30 is formed on the resistivity-enhancing structures 25 that are separately disposed on and protrudes from the surface of the light reflective layer 20, thus the buffer layer 30 that conforms to the resistivity-enhancing structures 25 and the light reflective layer 20 has a plurality of protrusions 301 extending from the surface adjacent to the binding layer 40. Moreover, the buffer layer 30 has a thermal expansion coefficient ranging between that of the epitaxial structure 10 and that of the second substrate 50.

Accordingly, by adopting the buffer layer 30 with uneven surface and a certain thermal expansion coefficient the stress generated between the epitaxial structure 10 and the second substrate 50 can be released without additional steps.

Thereafter, the structure is flipped upside down and the first substrate is then removed to expose the first surface 10a of the epitaxial structure 10, as shown in FIG. 1. The exposed first surface 10a may be roughened for the purpose of increasing the amount of scattering light emitting outwards from the first surface 10a. Then, a plurality of first electrode structures 70 are disposed over the first surface 10a, so as to electrically connote to the first surface 10a.

Figure 6:
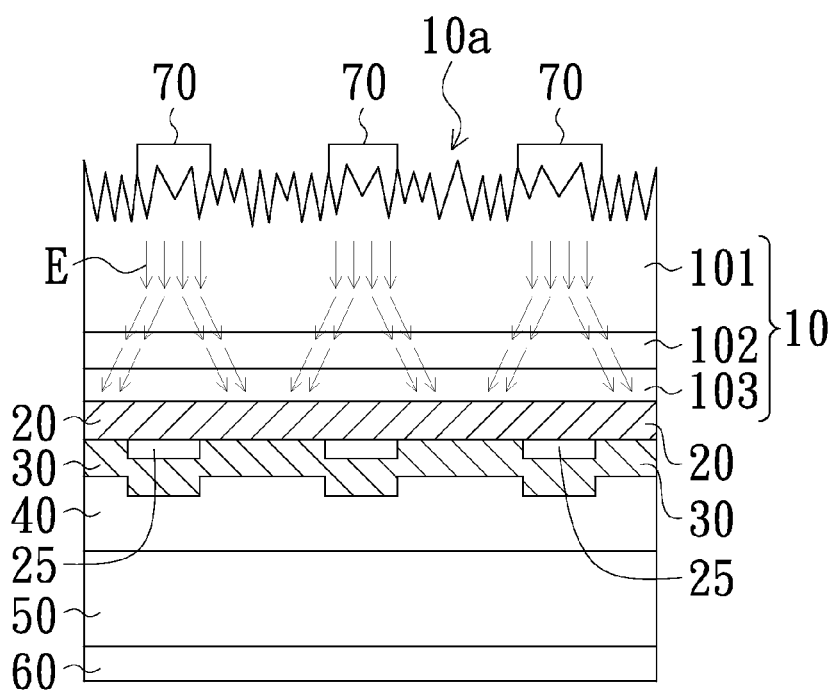
FIG. 6 is a cross-sectional view illustrating electric current flowing within the semiconductor light-emitting device in accordance with the first embodiment of the present invention.

It should be noted that the first electrode structures 70 are arranged corresponding to the positions of the resistivity-enhancing structures 25. For example, each of the first electrode structures 70 has a central axial aligning with that of the corresponding resistivity-enhancing structure 25, or in another embodiment, each of the resistivity-enhancing structure 25 has an edge aligning with the edge of the corresponding first electrode structure 70. Since the resistivity-enhancing structures 25 are made of insulation material that is capable of increasing resistivity of the regions where the resistivity-enhancing structures 25 are disposed and hindering electric current from flowing through these regions. Furthermore, because the resistivity-enhancing structures 25 disposed between the resistivity-enhancing structures 25 and the light reflective layer 20 are not arranged to gather around the center of the epitaxial structure 10. Thus the electric current E that always takes along the shortest route can be kept from flowing through the regions where the resistivity-enhancing structures 25 are disposed. As a result, the electric current E can be dispersed and kept from passing though the regions of the epitaxial structure 10 beneath the first electrode structures 70 (see FIG. 6). It is to say, most of the electric current E may passing around the regions of the epitaxial structure 10 beneath the first electrode structures 70, whereby light emitted from these regions may be decreased, and light emission around these regions may be enhanced significantly. Moreover, since most of the light emitting from the epitaxial structure 10 does not generated form the regions of the epitaxial structure 10 beneath the first electrode structures 70, thus while light generated by the epitaxial structure 10 is reflected by the light reflective layer 20 in order to direct the light emitting outwards from the first surface 10a, most of the emitting light should not be shielded and absorbed by the first electrode structures 70. Such that, the light-emitting efficiency of the semiconductor light-emitting device can be enhanced significantly.

Alternatively, the relative positions between the resistivity-enhancing structures 25, the light reflective layer 20, and the buffer layer 30 may be altered. For example, although the resistivity-enhancing structures 25 of the present embodiment is directly in contact with the light reflective layer 20, but in some other embodiments (not shown), the resistivity-enhancing structures 25 may be embedded in the light reflective layer, wherein the resistivity-enhancing structures 25 may have a plurality of grooves formed on the surface; those resistivity-enhancing structures are then disposed in those grooves and protruding from the surface of the light reflective layer; and the buffer layer is subsequently formed to covering the light reflective layer and the resistivity-enhancing structures. In a further embodiment (not shown), the resistivity-enhancing structures may be embedded within the buffer layer and formed by the following steps: A portion of the buffer layer is firstly formed on the light reflective layer; the resistivity-enhancing structures are then formed on the portion of the buffer layer; and the other portion of the buffer layer is subsequently formed on the resistivity-enhancing structures, so as to make the resistivity-enhancing structures embedded within the buffer layer.

Figure 2:
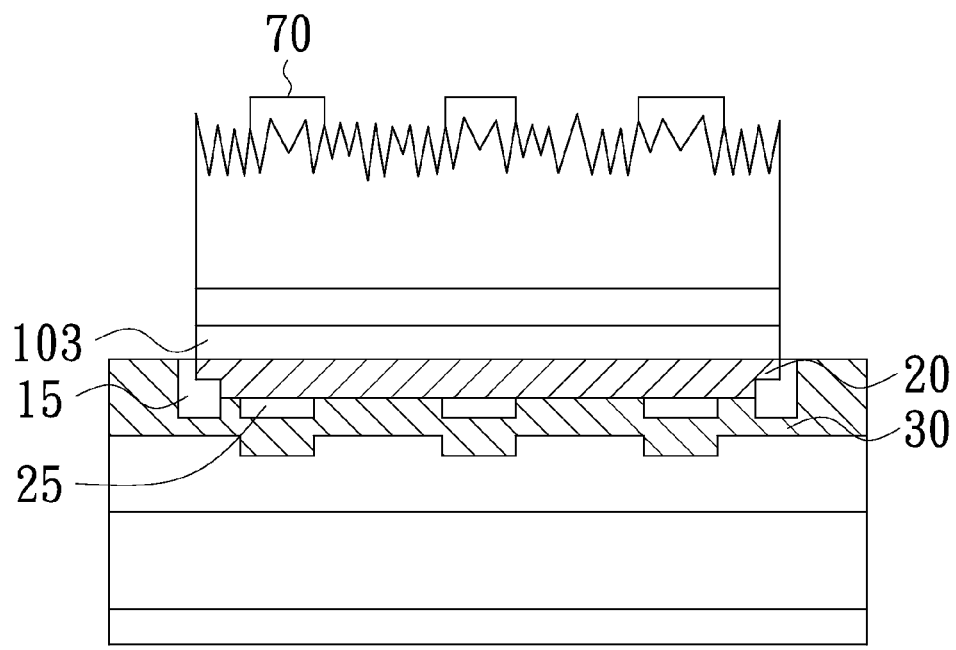
FIG. 2 is a cross-sectional view illustrating a semiconductor light-emitting device in accordance with a second embodiment of the present invention.

With reference to FIG. 2, a cross-sectional view of a semiconductor light-emitting device in accordance with a second embodiment of the present invention is schematically illustrated. Applicants found that an enclosed protection structure 15, disposed to surround a sidewall of the light reflective layer, is capable of hindering molecules of the light reflective layer 20 from migrating more effectively. The protection structure 15 may be made of an insulation material selected from a group consisting of titanium dioxide, silicon dioxide, indium tin oxide, silicon nitride, materials for forming a distributed bragg reflector and the arbitrary combinations thereof which is stable and hardly to be changed in physical property.

The differences between the second embodiment and the first embodiment are shown as follows: in the second embodiment, an indentation is firstly defined in the edge of the light reflective layer 20, and the resistivity-enhancing structures 25 and the protection structure 15 are then formed simultaneously with the same photomask (not shown), whereby the protection structure 15 can be disposed in the indentation and surrounding the sidewall of the light reflective layer 20, so as to form a hollow enclosed structure. Next, the buffer layer 30 is formed to envelop the enclosed structure and cover the protection structure 15, the light reflective layer 20, and the resistivity-enhancing structures 25. As a result, the outside sidewall of the protection structure 15 is totally enveloped by the buffer layer 30. The molecule migration of the light reflective layer 20 would be markedly depressed due to the cooperative wrapping of the protection structure 15 and the buffer layer 30, and the light-reflected efficiency of the light reflective layer 20 would be enhanced substantially. Moreover, in this embodiment, the resistivity-enhancing structure 25 and the protection structure 15 are formed in the same step of the manufacturing process with identical materials.

Figure 3:
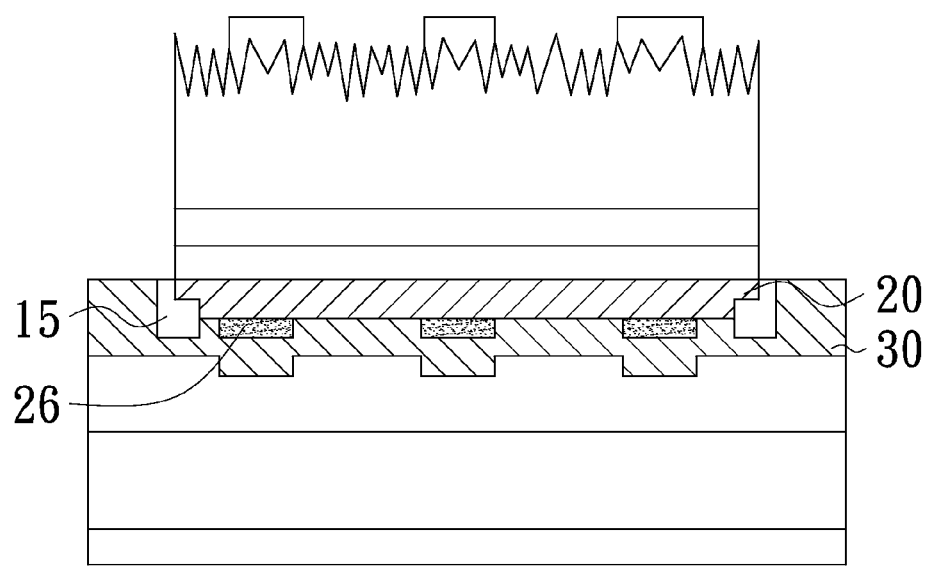
FIG. 3 is a cross-sectional view illustrating a semiconductor light-emitting device in accordance with a third embodiment of the present invention.

With reference to FIG. 3, a cross-sectional view of a semiconductor light-emitting device in accordance with a third embodiment of the present invention is schematically illustrated. The only difference between the third embodiment and the second embodiment of the present invention is that the materials consisting of the resistivity-enhancing structures 26 and the protection structure 15 are different. In the present embodiment, the resistivity-enhancing structures 26 and the protection structure 15 are formed in separate steps with different materials and subsequently covered by the buffer layer 30. In spite of the difference between the present embodiment and the second embodiment, the molecule migration of the light reflective layer 20 still can be effectively depressed by the resistivity-enhancing structure 26 and the protection structure 15, and the light-emitting efficiency of the semiconductor light-emitting device of the present embodiment can also be enhanced.

Figure 4:
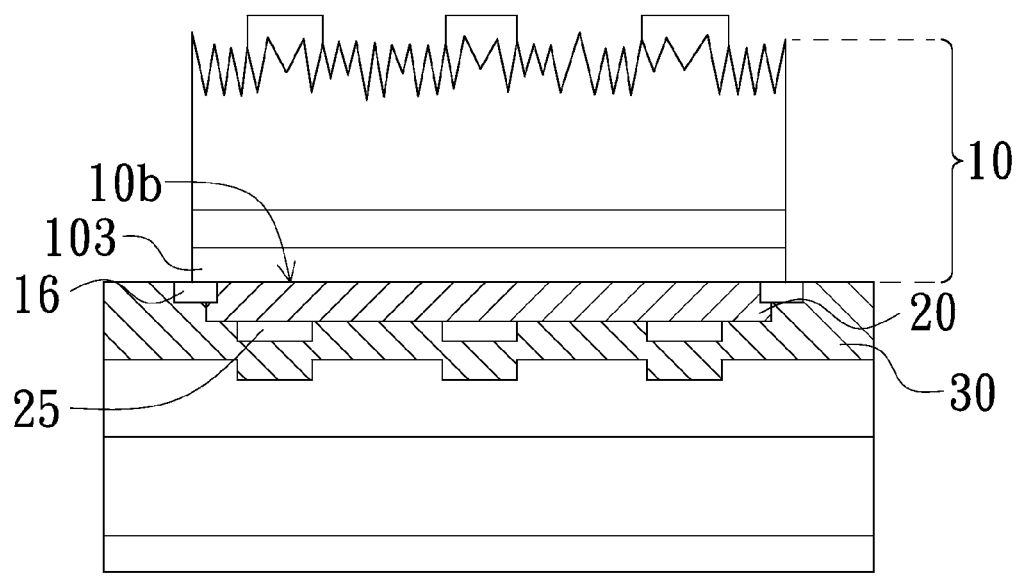
FIG. 4 is a cross-sectional view illustrating a semiconductor light-emitting device in accordance with a fourth embodiment of the present invention.

Referring to FIG. 4, a cross-sectional view of a semiconductor light-emitting device in accordance with a fourth embodiment of the present invention is schematically illustrated. The difference between the fourth embodiment and the second embodiment is stated as follows: In the fourth embodiment, the hollow enclosed protection structure 16 is formed on the edge of the second semiconductor layer 103. The light reflective layer 20 is then formed to cover the second semiconductor layer 103, so as to fill the protection structure 16. Subsequently steps that are identical to the first embodiment are performed to form the resistivity-enhancing structure 25 over the light reflective layer 20, wherein the materials of the resistivity-enhancing structure 25 and the protection structure 15 may be either identical or different.

Figure 5:
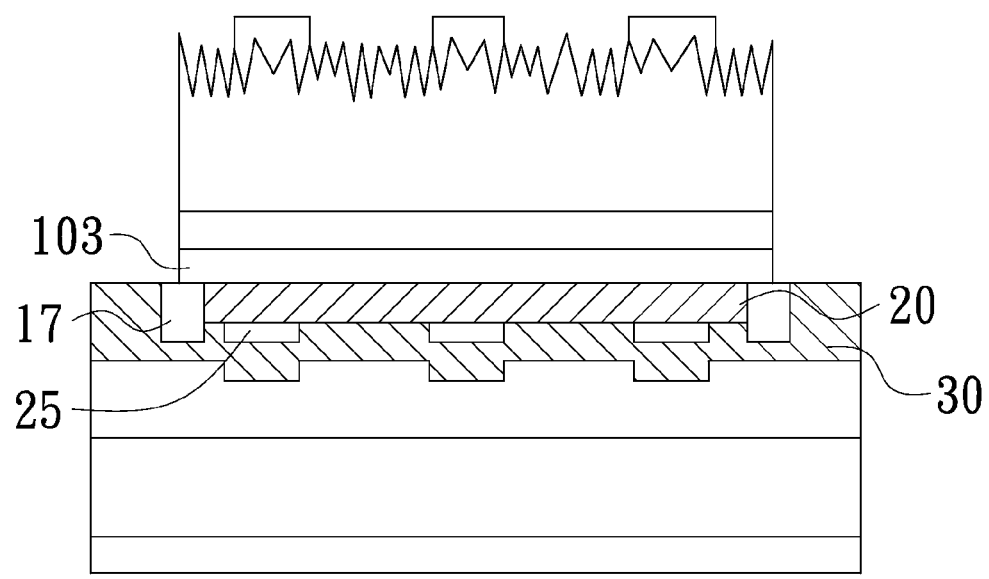
FIG. 5 is a cross-sectional view illustrating a semiconductor light-emitting device in accordance with a fifth embodiment of the present invention.

With reference to FIG. 5, a cross sectional view of a semiconductor light-emitting device in accordance with a fifth embodiment of the present invention is schematically illustrated. This embodiment is similar to the fourth embodiment of the present invention. However, there are several steps different from the fourth embodiment. In the fifth embodiment that step, while the light reflective layer 20 is formed to cover the second electricity semiconductor 103, the enclosed protection structure 17 is not covered by the light reflective layer 20. Instead, the enclosed protection structure 17 is filled by the buffer layer 30 after the resistivity-enhancing structure 25 is formed over the light reflective layer 20. Such that, the sidewall of the light reflective layer 20 is surrounded by the protection layer 17. Besides, the materials of the resistivity-enhancing structure 25 and the protection structure 17 may be either identical or different, and the material selection of the same may not substantially affect the functions and advantages of the present invention.

Figure 7:
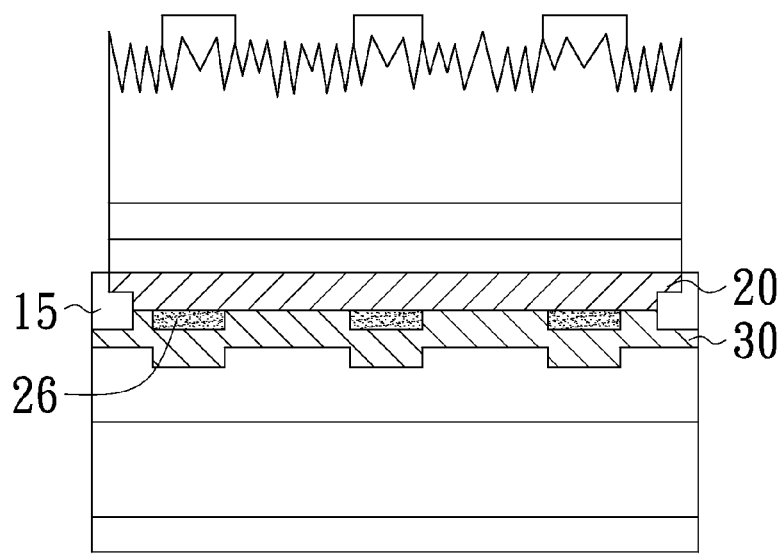
FIG. 7 is a cross-sectional view illustrating a semiconductor light-emitting device in accordance with a sixth embodiment of the present invention.

With reference to FIG. 7, a cross-sectional view of a semiconductor light-emitting device in accordance with a sixth embodiment of the present invention is schematically illustrated. Similar to the third embodiment, the buffer layer 30 covers the light reflective layer 20 and the resistivity-enhancing structure 25 as well as fills the protection structure 15. However, the only difference between the third embodiment and the sixth embodiment is that the outside sidewall of the protection structure 15 is not covered by the buffer layer 30. In spite of the difference between the present embodiment and the third embodiment, the objects and advantages of the present invention still can be accomplished.

In sum, It is found that to dispose a plurality of the resistivity-enhancing structures 25 between the light reflective layer 20 and the buffer layer 30 corresponding to the position of the first electrode structures 70 is capable of hindering the electric current from flowing through the regions of the epitaxial structure 10 beneath the first electrode structures 70. As a result, a large amount of the electric current would be kept from flowing through and be directed passing beside the regions. Thus, a large amount of light can be generated in the portions of the epitaxial structure 10 beside the regions and would not be shielded and absorbed by the non-transparent first electrode structures 70. Furthermore, the light-reflected efficiency would be effectively enhanced by the cooperative warping of the protection structure and the buffer layer 30 both covering the light reflective layer 20. Therefore, the light-emitting efficiency of the semiconductor light-emitting device could be enhanced by the aforementioned ways.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor light-emitting device, comprising steps of:
    forming a light-emitting epitaxial structure with a first surface and a second surface opposite to the first surface;
    forming a closed protection structure over the second surface;
    forming a light reflective layer over the second surface so that the light reflective layer is filled into the closed protection structure;
    forming an resistivity-enhancing structure over the light reflective layer;
    and
    forming a first electrode structure electrically connected to the first surface corresponding to a position of the resistivity-enhancing structure;
    wherein the closed protection structure is formed prior to the step of forming the light reflective layer and surrounds a sidewall of the light reflective layer.

2. The method for fabricating a semiconductor light-emitting device according to claim 1, wherein the step of forming the light-emitting epitaxial structure comprises:
    forming a light-emitting layer over a first semiconductor layer having a first conductivity type and a surface serving as the first surface, wherein the light-emitting layer is disposed away from the first surface;
    forming a second semiconductor layer having a second conductivity type over the light-emitting layer, wherein the second semiconductor layer has a surface serving as the second surface.

3. The method for fabricating a semiconductor light-emitting device according to claim 1, further comprising steps of:
    forming a buffer layer over the light reflective layer, wherein the buffer layer covers the resistivity-enhancing structure;
    forming a binding layer over the buffer layer;
    forming a substrate over the binding layer; and
    forming a second electrode structure over the substrate, wherein the second electrode structure is electrically connected to the substrate.

4. The method for fabricating a semiconductor light-emitting device according to claim 3, wherein the resistivity-enhancing structure is formed in the buffer layer.

5. The method for fabricating a semiconductor light-emitting device according to claim 3, wherein the closed protection structure is coated with the buffer layer.

* * * * *